(12) United States Patent
Chen et al.

(10) Patent No.: US 11,493,909 B1
(45) Date of Patent: Nov. 8, 2022

(54) METHOD FOR DETECTING ENVIRONMENTAL PARAMETER IN SEMICONDUCTOR FABRICATION FACILITY

(71) Applicant: TAIWAN SEMICONDUCTOR MANUFACTURING COMPANY LTD., Hsinchu (TW)

(72) Inventors: Lee-Chun Chen, Hsinchu (TW); Yi-Chien Yang, Hsinchu (TW); Chia-Lin Hsu, Tainan (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 17/232,589

(22) Filed: Apr. 16, 2021

(51) Int. Cl.
G05B 19/418 (2006.01)

(52) U.S. Cl.
CPC ........... G05B 19/41885 (2013.01); *G05B 2219/31466* (2013.01); *G05B 2219/45031* (2013.01)

(58) Field of Classification Search
CPC .... G05B 19/41885; G05B 2219/31466; G05B 2219/45031
See application file for complete search history.

(56) References Cited

U.S. PATENT DOCUMENTS

| | | | | |
|---|---|---|---|---|
| 4,666,565 A * | 5/1987 | Dobson | ............... | G01N 27/4045 205/780.5 |
| 5,789,024 A * | 8/1998 | Levy | ....................... | B01D 71/02 427/244 |
| 6,731,371 B1 * | 5/2004 | Shiraishi | ............. | G03F 7/70933 430/311 |
| 6,766,682 B2 * | 7/2004 | Engle | ................. | G01N 15/0826 73/38 |
| 9,779,972 B2 * | 10/2017 | Favre | ................ | H01L 21/67253 |
| 2003/0052083 A1 * | 3/2003 | Kim | ..................... | H01J 37/3299 118/712 |
| 2004/0163761 A1 * | 8/2004 | Strang | ................. | H01J 37/3244 257/E21.252 |

(Continued)

FOREIGN PATENT DOCUMENTS

| JP | 2003100838 A | * | 4/2003 |
|---|---|---|---|
| KR | 20110110063 A | * | 10/2011 |

(Continued)

*Primary Examiner* — Ronald D Hartman, Jr.
(74) *Attorney, Agent, or Firm* — WPAT Law; Anthony King

(57) ABSTRACT

A semiconductor fabrication facility (FAB) is provided. The FAB includes a number of processing tools. The FAB also includes a sampling station connected to the processing tools. In addition, the FAB includes a detection vehicle detachably connected to the sampling station and comprising a metrology module. When the detection vehicle is connected to the sampling station, a gas sample is delivered from one of the processing tools to the metrology module of the detection vehicle via the sampling station for performing a measurement of a parameter in related to the gas sample by the metrology module. In addition, the FAB includes a control system configured to issue a warning when the parameter in related to the gas sample from the one of the processing tools is out of a range of acceptable values associated with the one of the processing tools.

20 Claims, 11 Drawing Sheets

(56) References Cited

U.S. PATENT DOCUMENTS

| | | | | |
|---|---|---|---|---|
| 2007/0201016 | A1* | 8/2007 | Song | H01L 21/31116 |
| | | | | 257/E21.252 |
| 2018/0082875 | A1* | 3/2018 | Sasaki | H01L 21/67769 |
| 2018/0204742 | A1* | 7/2018 | Tateno | H01L 21/67017 |
| 2020/0201363 | A1* | 6/2020 | Hruzek | G05D 7/0652 |
| 2021/0235583 | A1* | 7/2021 | Yang | H01L 21/67389 |

FOREIGN PATENT DOCUMENTS

| | | | | |
|---|---|---|---|---|
| TW | 1720731 | * | 3/2021 | |
| TW | 202127533 A | * | 7/2021 | G01N 21/8806 |

* cited by examiner

METHOD FOR DETECTING ENVIRONMENTAL PARAMETER IN SEMICONDUCTOR FABRICATION FACILITY

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

ICs are typically fabricated by processing one or more wafers as a "lot" with using a series of wafer fabrication tools (i.e., "processing tools"). Each processing tool typically performs a single wafer fabrication process on the wafers in a given lot. For example, a particular processing tool may perform layering, patterning and doping operations or thermal treatment. A layering operation typically adds a layer of a desired material to an exposed wafer surface. A patterning operation typically removes selected portions of one or more layers formed by layering. A doping operation typically incorporates dopants directly into the silicon through the wafer surface, to produce p-n junctions. A thermal treatment typically heats a wafer to achieve specific results (e.g., dopant drive-in or annealing). As a result, wafers have to be moved between processing tools in a clean room.

However, when exposed to the open environment, wafers are vulnerable to the attacks of adverse substances such as moisture, oxygen, and various airborne molecular contaminants (AMC) sources, which include etching byproduct solvents, perfumes, storage materials, chamber residual gases, etc.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
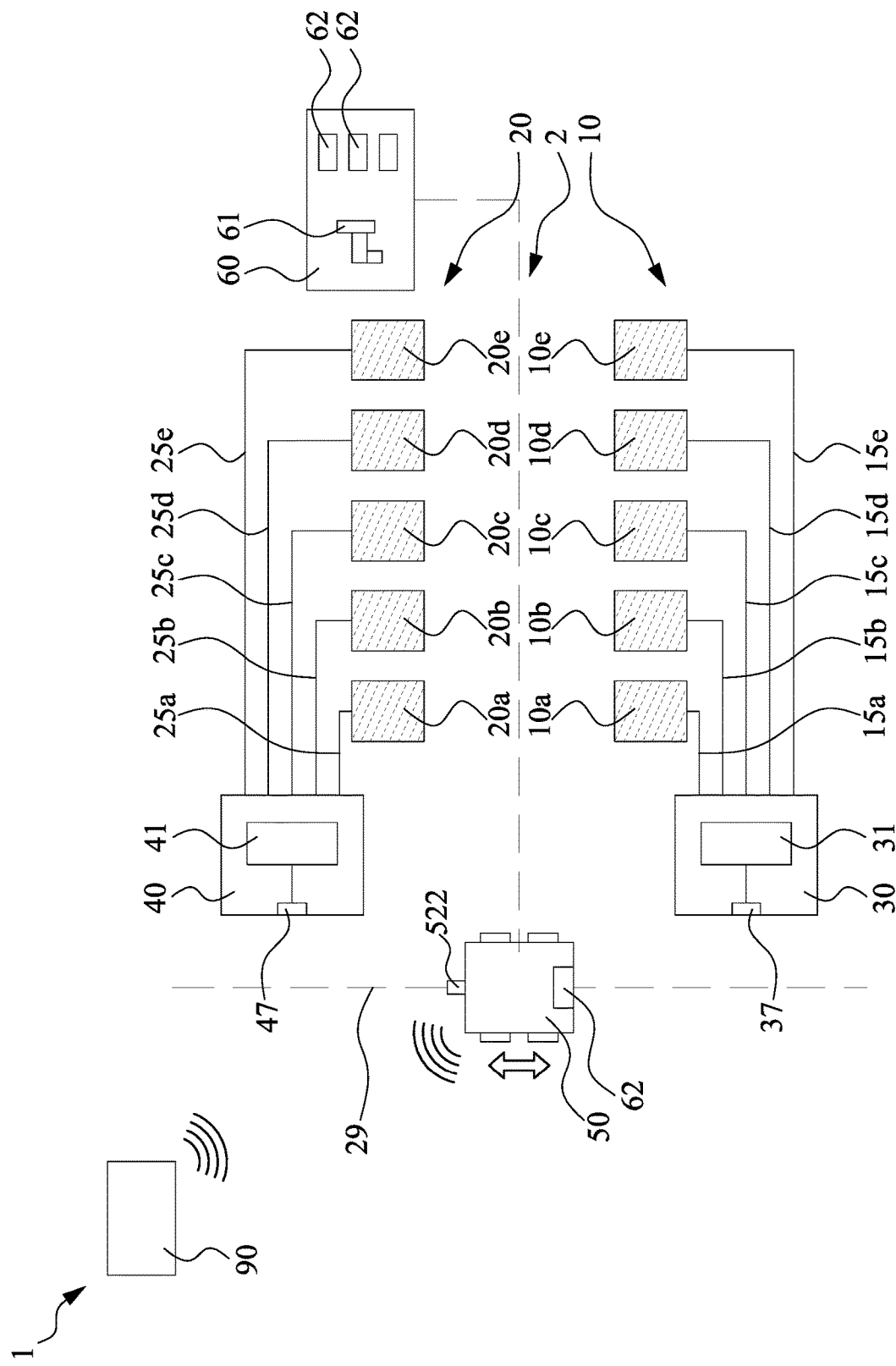
FIG. 1 is a schematic view of a semiconductor fabrication facility, in accordance with one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

As used herein, the terms "line," "piping," and "tubing" are used interchangeably and refer to any type, size, or configuration of flow conduit conventionally used in the art for transporting liquids and/or gaseous materials and combinations thereof.

Within a semiconductor fabrication facility (FAB) environment, contaminants can be generated in the form of gases, chemical vapors, micro/nano-scale aerosol particles, airborne molecular contamination (AMC), etc. The AMC level in cleanroom environments is predominately created by internal sources of solvents and acetic acid, re-entrainment of exhaust air, aromatic compounds, as well as material outgassing. AMC may cause adverse effects on production tools and consequently increase costs for FAB. Therefore, one objective of embodiments of the present disclosure is to provide an easier, faster and cheaper technology to realize a real-time monitoring of environment contaminant levels in ambient of a semiconductor fabrication facility and inside one or more processing tools.

FIG. 1 shows a schematic view illustrating a semiconductor fabrication facility 1, in accordance with one or more embodiments of the present disclosure. In accordance with some embodiments, the semiconductor fabrication facility 1 includes a first group of processing tools 10, a second group of processing tools 20, a number of sampling stations, such first sampling station 30 and second sampling station 40, a detection vehicle 50, and a battery station 60, and a control system 90. The elements of the semiconductor fabrication facility 1 may be positioned in a clean room where fabrication of a semiconductor products takes place.

In some embodiments, the first group of processing tools 10 and the second group of processing tools 20 are arranged for performing the same or different fabrication process over semiconductor wafers. The first group of processing tools 10 and the second group of processing tools 20 may include any type of wafer processing tools used in semiconductor chip fabrication. For example, some of the processing tools are deposition tools for forming a material layer over semiconductor wafers, and the other of the processing tools are lithography tools for performing a lithography process over the material layer formed on the semiconductor wafers. In addition, the processing tools may further include metrology, inspection, testing or other tools.

In some embodiments, the first group of processing tools 10 includes a number of processing tools 10a, 10b, 10c, 10d and 10e. The processing tools 10a, 10b, 10c, 10d and 10e are arranged along a line. In addition, the second group of processing tools 20 includes a number of processing tools 20a, 20b, 20c, 20d and 20e. The processing tools 20a, 20b, 20c, 20d and 20e are arranged along another line which is parallel to the line along which the processing tools 10a, 10b, 10c, 10d and 10e are arranged. A passage 2 is formed between the first group of processing tools 10 and the second group of processing tools 20. The passage 2 allows personnel and the detection vehicle 50 to pass through.

The semiconductor wafer to be processed in the present disclosure may be made of silicon or other semiconductor materials. Alternatively or additionally, the semiconductor wafer may include other elementary semiconductor materials such as germanium (Ge). In some embodiments, the semiconductor wafer is made of a compound semiconductor such as silicon carbide (SiC), gallium arsenic (GaAs), indium arsenide (InAs), or indium phosphide (InP). In some embodiments, the semiconductor wafer is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer includes an epitaxial layer. For example, the semiconductor wafer has an epitaxial layer overlying a bulk semiconductor. In some other embodiments, the semiconductor wafer may be a silicon-on-insulator (SOI) or a germanium-on-insulator (GOI) substrate.

The semiconductor wafer may have various device elements. Examples of device elements that are formed in the semiconductor wafer include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, a shallow trench isolation (STI) layer, an inter-layer dielectric (ILD), or an inter-metal dielectric layer covers the device elements formed on the semiconductor wafer.

The first sampling station 30 is configured to collect gas sample from the processing tools 10a, 10b, 10c, 10d and 10e of the first group of processing tool 10 through a number of sampling tubes 15a, 15b, 15c, 15d and 15e. The second sampling station 40 is configured to collect gas sample from the processing tools 20a, 20b, 20c, 20d and 20e of the second group of processing tool 20 through a number of sampling tubes 25a, 25b, 25c, 25d and 25e. With the first sampling station 30 and the second sampling station 40, the detection vehicle 50 is able to measure the gas sample of one of a predetermined processing tools by establishing connection with one of the first sampling station 30 and the second sampling station 40.

Figure 2:
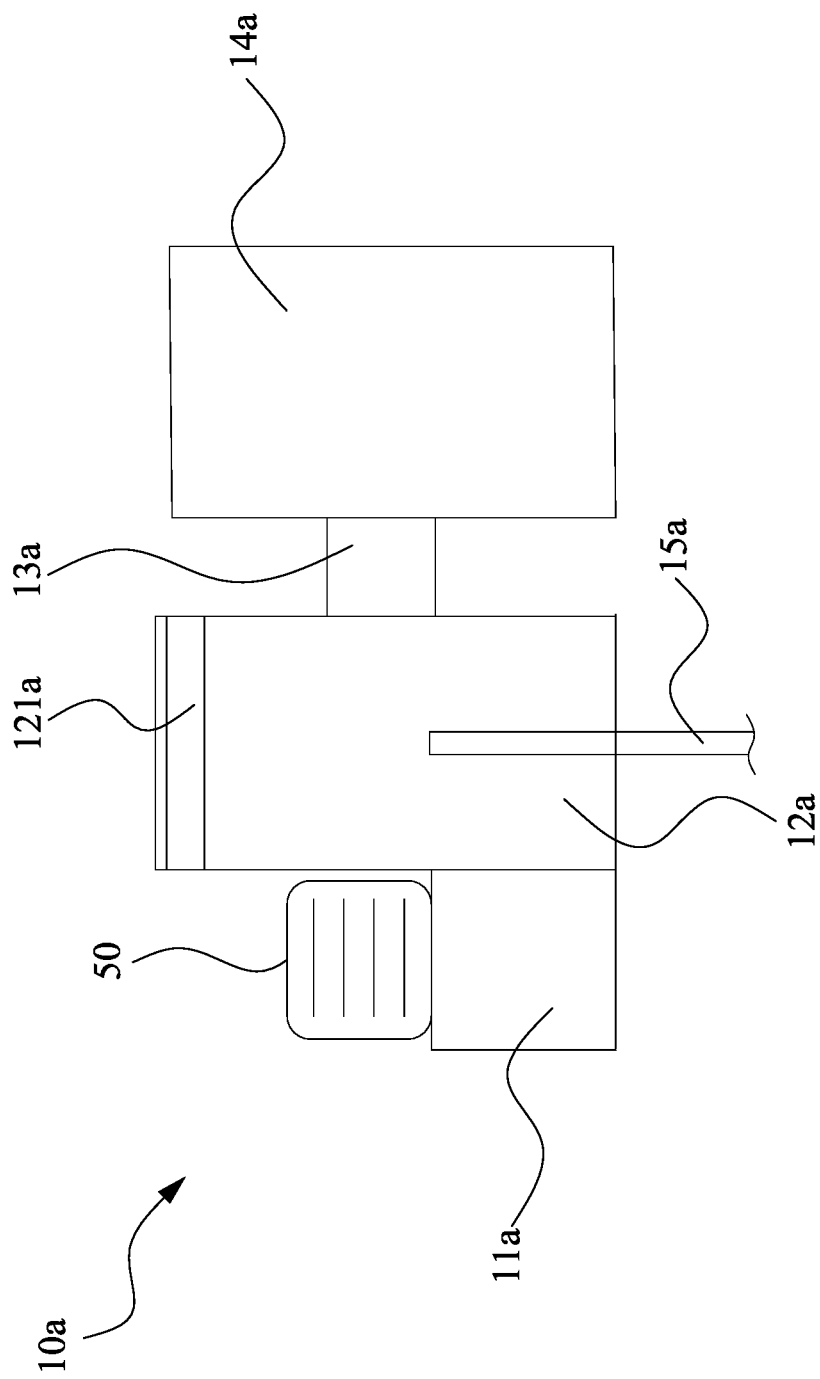
FIG. 2 shows a schematic view of a processing tool connected with a sampling tube, in accordance with one or more embodiments of the present disclosure.

FIG. 2 shows a schematic view of the processing tool 10a connected with the sampling tube 15a, in accordance with one or more embodiments of the present disclosure. In some embodiments, the sampling tube 15a is configured to collect gas inside the processing tool 10a. For example, the sampling tube 15a may be connected to an interface 12a of the processing tool 10a which is positioned between a load port 11a and a load lock module 13a. A transferring member (e.g., robot arm, not shown in figures) may be positioned in the interface 12a to transport the wafer from the wafer carrier 50 to the load lock module 13a. Before the air supplied into the interface 12a of the processing tool 10a from the clean room, the air may be filtered by the filter 121a positioned on the top of the interface 12a. The filter 121a may include a high efficiency particulate air filter. The load lock module 13a is a vacuum chamber used for loading semiconductor wafers from ambient air pressure conditions (e.g., interface 12a) into the main vacuum processing chamber (e.g., processing chamber 14a) where the semiconductor wafer is processed.

With the sampling tube 15a, a gas sample inside the interface 12a can be collected and monitored by the detection vehicle 50 (FIG. 1) in a real-time. As a result, wafer contamination can be prevented or mitigated during the transportation of wafer in the interface 12a. In some embodiments, the interface 12a may be a facility interface. In some embodiments, the interface 12a may comprise an equipment front end module (EFEM).

It would be noted that the sampling stations (i.e., the position of the gas inlets of the sampling tubes) is not limited to the embodiment of FIG. 2. The sampling stations can be set at any desired positions in the processing tools. These sampling stations may be placed at a position where operators believe that semiconductor wafers may be contaminated by AMC substances as long as the sampling tubes can be extended to the desired position. In one exemplary embodiment, a length of each of the sampling tubes is in a range from about 1 m to about 20 m.

Figure 3:
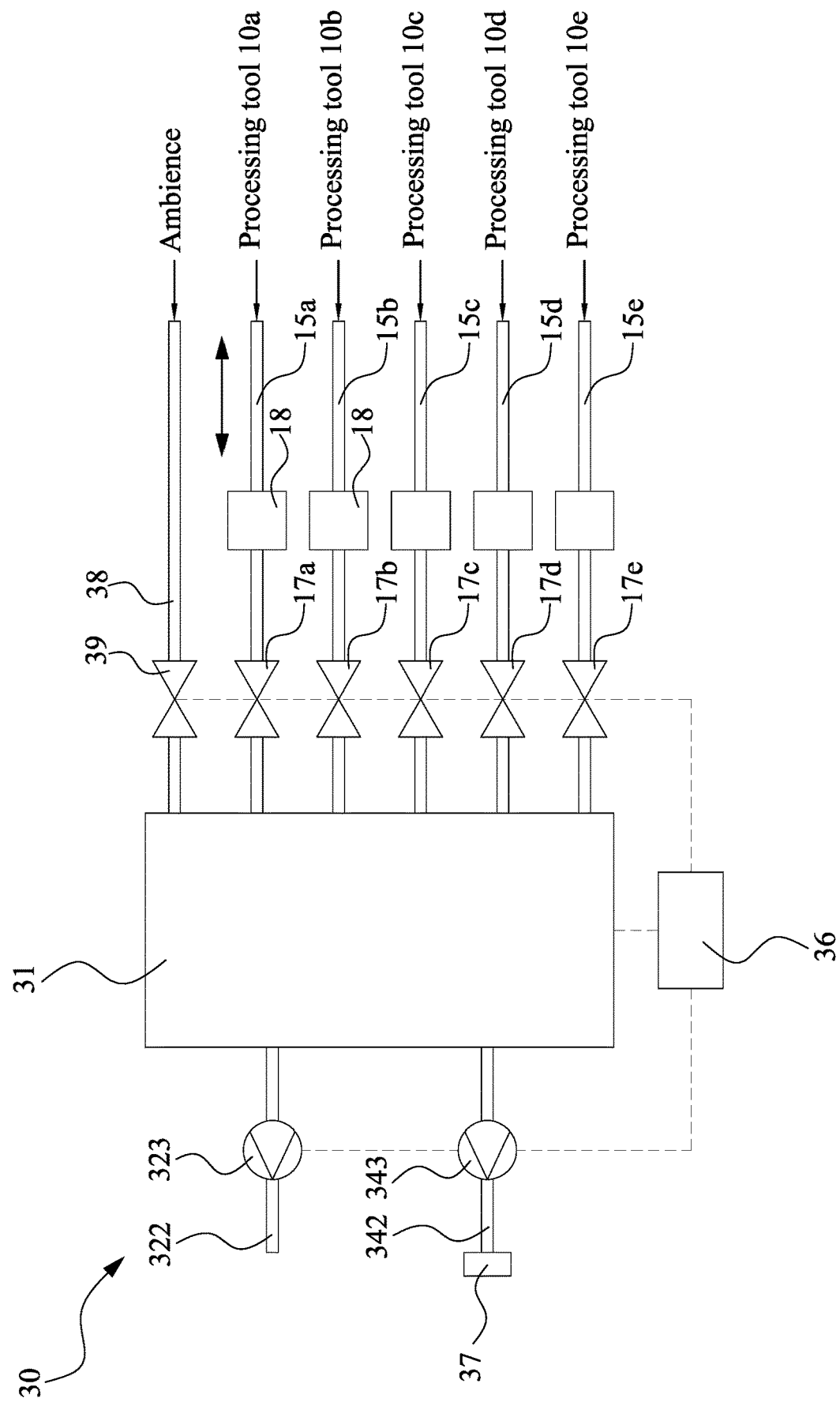
FIG. 3 is a schematic view of a sampling station connected with sampling tubes, in accordance with one or more embodiments of the present disclosure.

FIG. 3 is a schematic view of the first sampling station 30 connected with sampling tubes 15a, 15b, 15c, 15d and 15e, in accordance with one or more embodiments of the present disclosure. In some embodiments, the first sampling station 30 includes a valve manifold box 31, an exhaust port 322 and a connection port 342. The valve manifold box 31 is provided to allow switching the gas sample from one of the processing tools 10a, 10b, 10c, 10d and 10e to feed gas to the detection vehicle 50 via the connection port 342. The valving and associated piping branches in the valve manifold box 31 are configured and adapted accordingly to operably isolate or allow gas sample from one of the processing tools 10a, 10b, 10c, 10d and 10e to the detection vehicle 50 for measurement. In some embodiments, the valve manifold box 31 is operable to provide gas sample from two or more the processing tools 10a, 10b, 10c, 10d and 10e via the connection port 342.

Figure 4:
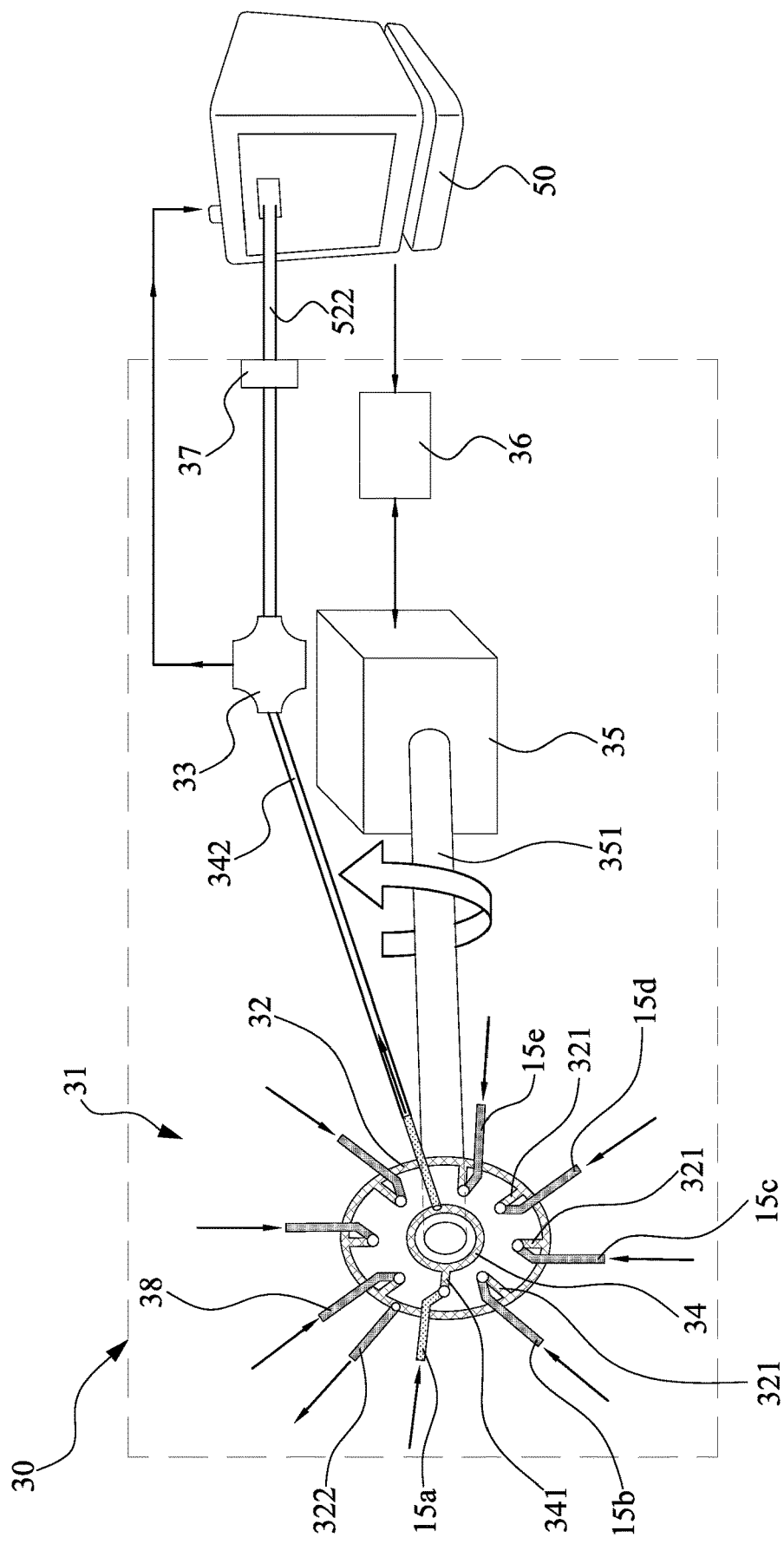
FIG. 4 is a schematic view of a sampling station, in accordance with one or more embodiments of the present disclosure.

One exemplary embodiment of the valve manifold box 31 is shown in FIG. 4. In some embodiments, the valve manifold box 31 is a rotatory valve (hereinafter referred to as rotatory valve) with a first conduit 32 and a second conduit 34. The first conduit 32 and the second conduit 34 are arranged in concentric circles, and the first conduit 32 surrounds the second conduit 34. The first conduit 32 includes a number of inlet ports 321 inwardly extending toward a center of the rotatory valve 31. The second conduit 34 includes one inlet port 341 outwardly extending away from the center of the rotatory valve 31. The exhaust port 322 is connected to the first conduit 32 and extends away from the center of the rotatory valve 31. The connection port 342 is connected to the second conduit 34 and extends away from the center of the rotatory valve 31.

In operation, as shown in FIG. 4, one of the sampling tubes 15a, 15b, 15c, 15d and 15e (e.g. sampling tube 15a) is connected to the inlet port 341 of the second conduit 34, and the remaining sampling tubes 15a, 15b, 15c, 15d and 15e (e.g. sampling tubes 15b, 15c, 15d and 15e) are connected to the inlet ports 321 of the first conduit 32. The inlet ports 321 of the first conduit 32 and the inlet port 341 of the second conduit 34 are evenly spaced apart in a circumferential direction of the rotatory valve 31. As a result, the gas sample from one of the sampling tube 15a is delivered to the connection port 342 via the second conduit 34, and the gas sample from the reaming sampling tubes sampling tubes 15b, 15c, 15d and 15e is delivered to the exhaust port 322 via the first conduit 32. In some embodiments, during the delivery of the gas sample, the flowing rate of the gas sample in the connection port 342 is measured by a flow meter 33 that is connected to the connection port 342. The data in relation to the detection result of the flowing rate can be transmitted to the detection vehicle 50.

In some embodiments, the connection of the rotatory valve 31 and the sampling tubes 15a, 15b, 15c, 15d and 15e is controlled by a driving tool 35, such as a step motor. The driving tool 35 is connected to the center of the rotatory valve 31 via a shaft 351. The driving tool 35 controls the connection of the rotatory valve 31 and the sampling tubes 15a, 15b, 15c, 15d and 15e by changing a rotation angle of the rotatory valve 31. For example, in the case of FIG. 4, there are seven (7) inlet ports 321 of the first conduit 32 and one inlet port 341 of the second conduit 34, to change the connection of the rotatory valve 31 and the sampling tubes 15a, 15b, 15c, 15d and 15e, the driving tool 35 may actuate the rotatory valve 31 to rotate a given rotation angle which is equal to multiple of 45 degrees. The operation of the driving tool 35 may be initiated by a signal issued by the detection vehicle 50 when the detection vehicle 50 is connected to the sampling station 31.

Referring FIG. 3 again, in some embodiments, the sampling tubes 15a, 15b, 15c, 15d and 15e are connected with fluid regulators 17a, 17b, 17c, 17d and 17e for controlling the flow of the gas sample in the sampling tubes 15a, 15b, 15c, 15d and 15e. Examples of the fluid regulators 17a, 17b, 17c, 17d and 17e include solenoid valve, MFC (mass flow controller) or the like. In addition, the sampling tubes 15a, 15b, 15c, 15d and 15e are connected with hose reels 18 for storing the sampling tubes 15a, 15b, 15c, 15d and 15e. The hose reels 18 may include a cylindrical spindle made of either metal, fiberglass, or plastic and may be spring driven, hand crank, or motor driven. When the one of the corresponding processing tools 10a, 10b, 10c, 10d and 10e is removed from the sampling station 30 under a replacement operation, the sampling tubes 15a, 15b, 15c, 15d and 15e can be stored in the hose reels 18 and be reused to connect with a new processing tool, thereby saving a manufacturing cost and reducing waste.

In some embodiments, the gas sample from the processing tools 10a, 10b, 10c, 10d and 10e is driven to flow by the pumps 323 and 343 connected to the exhaust port 322 or the connection port 342. The pumps 323 and 343 and the fluid regulators 17a, 17b, 17c, 17d and 17e may be controlled in response to signals issued by a controller 36 of the first sampling station 30. In cases where the hose reels 18 is driven by a motor, the hose reels can be also controlled in response to signals issued by the controller 36 of the first sampling station 30.

In some embodiments, as shown in FIG. 3, a bypassing line 38 is connected to an upstream of the valve manifold box 31 via a valve 39. The bypassing line 38 is configured to collect ambient air in the semiconductor fabrication facility 1. By connecting the bypassing line 38 with either one of the exhaust port 322 or the connection port 342, the remaining gas in the exhaust port 322 or the connection port 342 in the rotatory valve 31 may be removed so as to improve the accuracy of the measurement of the gas sample. In some alternative embodiments, the bypassing line 38 is connected to multiple gas sources. A zero-order standard gas (such as nitrogen gas) may be supplied to the detection vehicle 50 via the rotatory valve 31 first to execute a zero-order calibration. After zero-order calibration, a standard gas (such as acetone gas) is supplied to the detection vehicle 50 to execute a full-width calibration. An adjustment is made to the detection vehicle 50 when the detection vehicle 50 in either zero-order calibration or full-width calibration does not agree with value of the applied standard.

In some embodiments, the configurations of the second sampling station 40 is similar to that of the first sampling station 30. For the sake of brevity, it will not be repeated here. In some embodiments, the first and the second sampling stations 30 and 40 are positioned away from the passage 2 of the semiconductor fabrication facility 1. For example, the second sampling stations 30 and 40 are located at corners of the semiconductor fabrication facility 1. As a result, when the detection vehicle 50 is connected to one of the first and the second sampling stations 30 and 40 for measuring parameters of gas sample collected by the first and the second sampling stations 30 and 40, the detection vehicle 50 will not hinder the operators or another detection vehicle 50 from moving along the passage 2.

Figure 5:
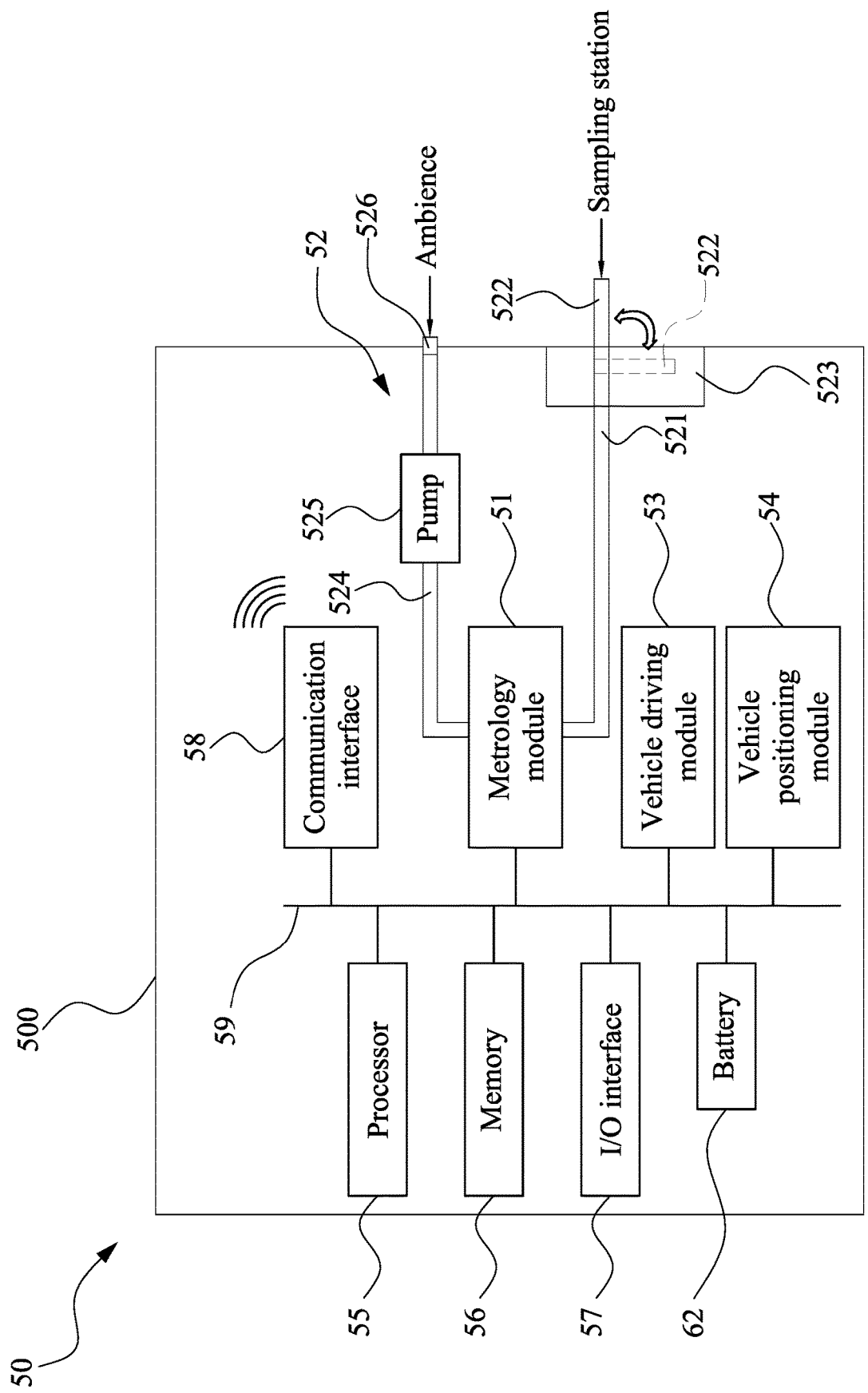
FIG. 5 is a block diagram of a detection vehicle, in accordance with one or more embodiments of the present disclosure.

FIG. 5 is a block diagram of the detection vehicle 50, in accordance with one or more embodiments of the present disclosure. The detection vehicle 50 is configured to monitor at least one environmental condition in the semiconductor fabrication facility 1 or at least one parameter in relation to gaseous material in the processing tools in real-time. In some embodiments, the detection vehicle 50 automatically moves to different locations in the semiconductor fabrication facility 1 to measure environmental conditions of the semiconductor fabrication facility 1 in different positions. The detection vehicle 50 may move along a predetermined path 29 (FIG. 1) to patrol the semiconductor fabrication facility 1 so as to detect if there is an abnormality in the semiconductor fabrication facility 1. Alternatively, the detection vehicle 50 may move to one of the first sampling station 30 and the second sampling station 40 to measure at least one parameter of a gas sample collected by the first sampling station 30 or the second sampling station 40.

In some embodiments, the detection vehicle 50 includes a metrology module 51, a gas delivery module 52, a vehicle driving module 53, a vehicle positioning module 54, a processor 55, a memory 56, an input/output interface 57 (hereinafter "I/O interface"), a communication interface 58, a system bus 59 and a battery 62.

In some embodiments, components in the detection vehicle 50 may be combined or omitted such as, for example, not including the communications interface. In some embodiments, the detection vehicle 50 may include other components not shown in FIG. 5. For example, the detection vehicle 50 also may include an alarming module for producing visual warning or audible warning.

The metrology module 51 is configured to measure at least one parameter of the gas sample collected by the sampling station 30 or 40 or collected from ambience of the semiconductor fabrication facility 1. In some embodiments, the gas sample is delivered to the metrology module 51 via the gas delivery module 52. The gas delivery module 52 includes a first gas line 521 and a second gas line 524 for guiding the gas sample outside the detection vehicle 50 into the metrology module 51.

The first gas line 521 is used for guiding the gas sample from the sampling station to the metrology module 51. In some embodiments, the first gas line 521 has a distal end 522 extending through a wall of the housing 500 of the detection vehicle 50. A guiding mechanism 523 may be connected to the distal end 522 of the first gas line 521 to control the position of the distal end 522. For example, the guiding mechanism 523 may include a motor (not shown in figure) and change the position of the distal end 522 of the first gas line 521 from a storage position (shown in dashed line) to an extended position (shown in solid line). In the extended position, the distal end 522 of the first gas line 521 can be inserted into a fastening member 37 or 47 (FIG. 1) of the sampling station 30 or 40.

The second gas line 524 is used for guiding the gas sample from ambience of the semiconductor fabrication facility 1 to the metrology module 51. In some embodiments, an end of the second gas line 524 is connected to a vent 526 formed on the housing 500 of the detection vehicle 50. A pump 525 is connected to the second gas line 524 to draw the ambient gas sample in the semiconductor fabrication facility 1 to the metrology module 51 for measurement. In some embodiments, the detection vehicle 50 includes a number of second gas lines 524 and a number of vents 526 formed on the housing 500, and each of the second gas lines 524 connects one of the vents 526 to the metrology module 51. The vents 526 may be formed at different sides of the detection vehicle 50 so as to collect ambient gas sample around the detection vehicle 50.

The metrology module 51 may carry one or more of the following detectors: a temperature sensor, a humidity sensor, a particle detector, and AMC detector for environmental monitoring. In some embodiments, the plurality of detectors can provide real-time continuous monitoring of environment parameters, including temperature, humidity, magnetic field strength/direction, inorganic ion type/concentration in micro/nano-scale aerosol particles, organic contaminant concentration, particle concentration, total organic carbon (TOC), graphite fluorine intercalation compounds (CxF), etc.

In some embodiments, the metrology module 51 is used for detecting contaminants in air within a FAB facility, including ionic species in forms of micro/nano-scale aerosol particles such as for instance $F^-$, $Cl^-$, $NO^{3-}$, $PO_4^{3-}$, $SO_4^{2-}$, $NH_4^-$, and $NO_2^-$. In some other embodiments, the metrology module 51 is used for detecting organic species such as for instance acetone/IPA, Propylene Glycol Methyl Ether (PGME), toluene, propylene glycol monomethyl ether acetate (PGMEA). In some embodiments, contaminant levels of these ionic and organic species in a typical FAB facility can be in a range of a few parts per million (ppm) and a few tens of ppm. The metrology module 51 for detecting contaminant levels may have the following properties, including low drift and noise level, high sensitivity, fast response time, high reliability, compact size/weight, and low power consumption, in accordance with various embodiments.

In some embodiments, the metrology module 51 is a chromatography instrument. A chromatography typically together with a mass spectrometry can be used to provide detailed analysis of contamination species and their concentration. Qualitative and quantitative analysis of common ions in their different forms and matrices in trace and ultra-trace concentrations can be detected using this method.

In certain embodiments, the chromatography instrument can be a Thermal desorption (TD) coupled with a gas chromatography with a mass spectrometry (GC-MS). The TD-GCMS can be used to as an AMC detector to detect volatile AMC contaminants. With TD-GCMS, sorption tubes are heated to volatilize collected organics which are then analyzed by GC-MS. In some embodiments, an AMC detector can be a thermal conductivity sensor based on the detection of different heat conductivity of gases and their concentration in air. In some embodiments, air samples can be concentrated by using impingers or sorption tubes in order to monitor trace contaminants in air, wherein an impinger is a water-filled tube through which the air sample is bubbled. Airborne contaminants accumulate in the water, which can be then analyzed, according to certain embodiments.

In some embodiments, the metrology module 51 is a photoionization detector (PID). The PID measures volatile organic compounds and other gases in concentrations from sub parts per billion to 10 000 parts per million (ppm). The PID is an efficient and inexpensive detector for many gas and vapor analyses. The PID produces instantaneous readings, operate continuously, and can be used to measure gas chromatography. With the PID, possible exposure to volatile organic compounds (VOCs) such as solvents, fuels, heat transfer fluids, lubricants, etc. during manufacturing processes and waste handling can be monitored.

In some other embodiments, the metrology module 51 is a flame ionization detector (FID), a combustible gas indicator (CGI), portable infrared (IR) spectrophotometer, gas chromatography and nitrogen/phosphorus detector (GC/NPD), inductively coupled plasma atomic emission spectrometry (ICP-AES), GC with a thermal energy analyzer (GC-TEA), or GC-using an electrical conductivity detector (GC-ECD). In some embodiments, a plurality of ion and AMC detectors and a combination thereof can be used according to the type of contaminants and their concentrations.

The vehicle driving module 53 is configured to drive the movement of the detection vehicle 50. The vehicle positioning module 54 includes a number of sensors and is configured to sense the environment. Examples of the sensors for the vehicle positioning module 54 includes laser scanner, ultrasonic sensor, infrared (IR) sensor and camera. The vehicle driving module 53 may control the movement of the detection vehicle 50 in response to a command issued from the control system 90. While at the same time, the sensory data produced by the vehicle positioning module 54 can be used as an auxiliary information for driving the detection vehicle 50 to prevent accidental collision with operators, processing tool, or another detection vehicle 50 in the semiconductor fabrication facility 1. In some embodiments, the sensory data produced by the vehicle positioning module 54 also can be used to facilitate the connection of the first gas line 521 with the sampling station 30 or 40.

The processor 55 may comprise any processing circuitry operative to control the operations and performance of the metrology module 51, the gas delivery module 52, the vehicle driving module 53 and the vehicle positioning module 54. In various aspects, the processor 55 may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device.

In various aspects, the processor 55 may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory 56.

In some embodiments, the memory 56 may comprise any machine-readable or computer-readable media capable of storing data, including both volatile/non-volatile memory and removable/non-removable memory. The memory 56 may comprise at least one non-volatile memory unit. The non-volatile memory unit is capable of storing one or more software programs.

The software programs may contain, for example, applications, user data, device data, and/or configuration data, or combinations therefore, to name only a few. The software programs may contain instructions executable by the various components of the metrology module 51, the gas delivery module 52, the vehicle driving module 53.

For example, memory 56 may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory 56 may contain an instruction set, in the form of a file for executing a method of generating one or more timing libraries as described herein. The instruction set may be stored in any acceptable form of machine readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor 55.

In some embodiments, the I/O interface 57 may comprise any suitable mechanism or component to at least enable a user to provide input to the metrology module 51, the gas delivery module 52, and enable the vehicle driving module 53 and the metrology module 51, the gas delivery module 52, the vehicle driving module 53 to provide output to the user. For example, the I/O interface 57 may comprise any suitable input mechanism, including but not limited to, a button, keypad, keyboard, click wheel, touch screen, or motion sensor. In some embodiments, the I/O interface 57 may comprise a capacitive sensing mechanism, or a multi-touch capacitive sensing mechanism (e.g., a touch screen).

In some embodiments, the I/O interface 57 may comprise a visual peripheral output device for providing a display visible to the user. For example, the visual peripheral output device may comprise a screen such as, for example, a Liquid Crystal Display (LCD) screen. The visual peripheral output device also may comprise display drivers, circuitry for driving display drivers, or both. The visual peripheral output device may be operative to display content under the direction of the processor 55. For example, the visual peripheral output device may be able to play media playback information, application screens for application implemented on the metrology module 51, the gas delivery module 52, the vehicle driving module 53, information regarding ongoing communications operations, information regarding incoming communications requests, or device operation screens, to name only a few.

In some embodiments, the communications interface 58 may comprise any suitable hardware, software, or combination of hardware and software that is capable of coupling the metrology module 51, the gas delivery module 52, the vehicle driving module 53 to one or more networks and/or additional devices (such as, for example, the control system 90). The communications interface 58 may be arranged to operate with any suitable technique for controlling information signals using a desired set of communications protocols, services or operating procedures. The communications interface 58 may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Accordingly, in various aspects, the communications interface 58 may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface 58 may comprise a wireless interface comprising one or more antennas, transmitters, receivers, transceivers, amplifiers, filters, control logic, and so forth.

In various aspects, the communications interface 58 may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electro-magnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, the metrology module 51, the gas delivery module 52, the vehicle driving module 53 may include a system bus 59 that couples various system components including the processor 55, the memory 56, and the I/O interface 57. The system bus 59 can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect Card International Association Bus (PCMCIA), Small Computers Interface (SCSI) or other proprietary bus, or any custom bus suitable for computing device applications.

Figure 6A:
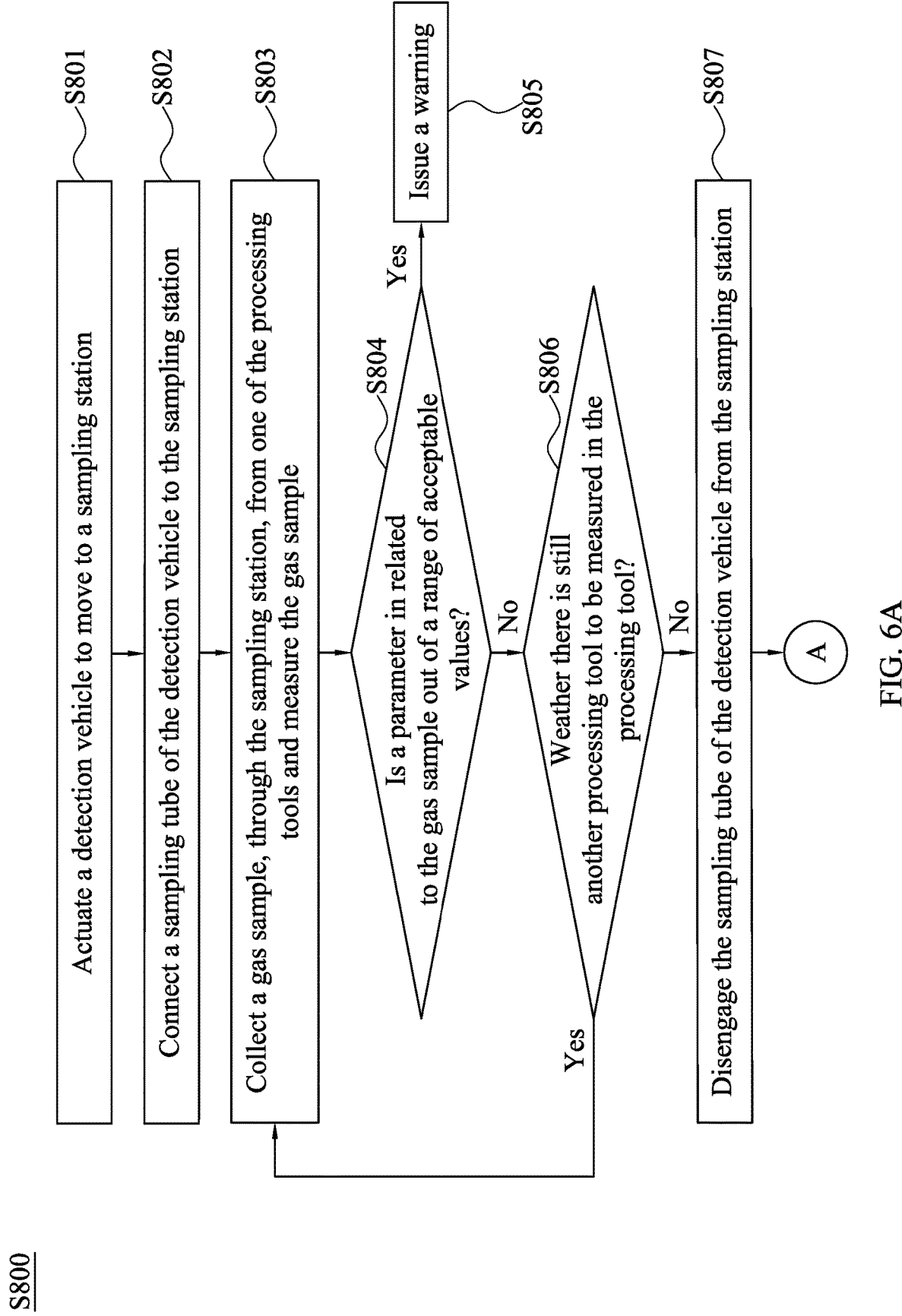
FIGS. 6A and 6B are a flow charts illustrating a method of monitoring a semiconductor fabrication facility, in accordance with one or more embodiments of the present disclosure.
Figure 6B:
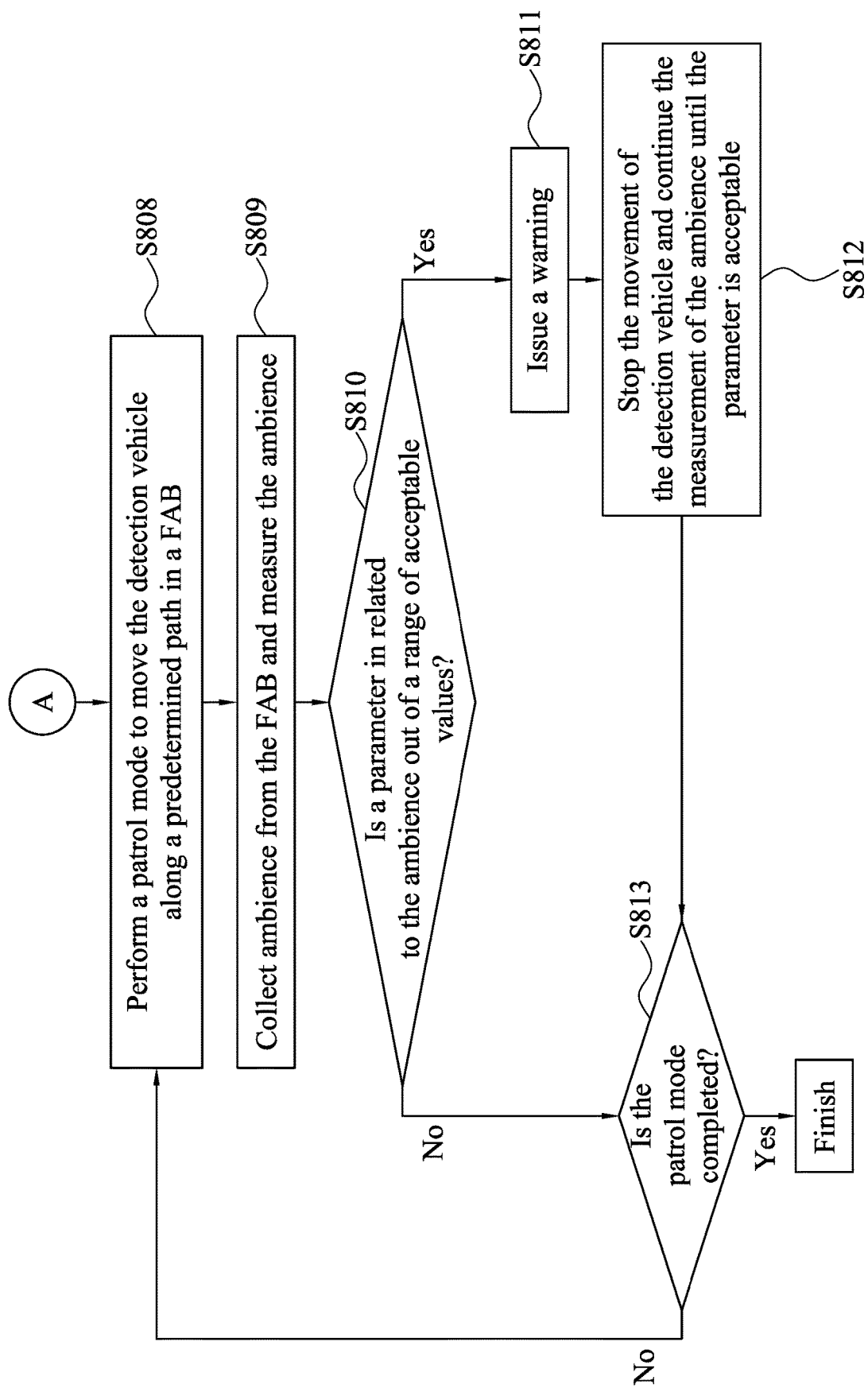

FIGS. 6A and 6B are flow charts illustrating a method S800 of monitoring a semiconductor fabrication facility, in accordance with various aspects of one or more embodiments of the present disclosure. For illustration, the flow chart will be described along with the drawings shown in FIGS. 1-5 and 7-10. Some of the described stages can be replaced or eliminated in different embodiments.

Figure 7:
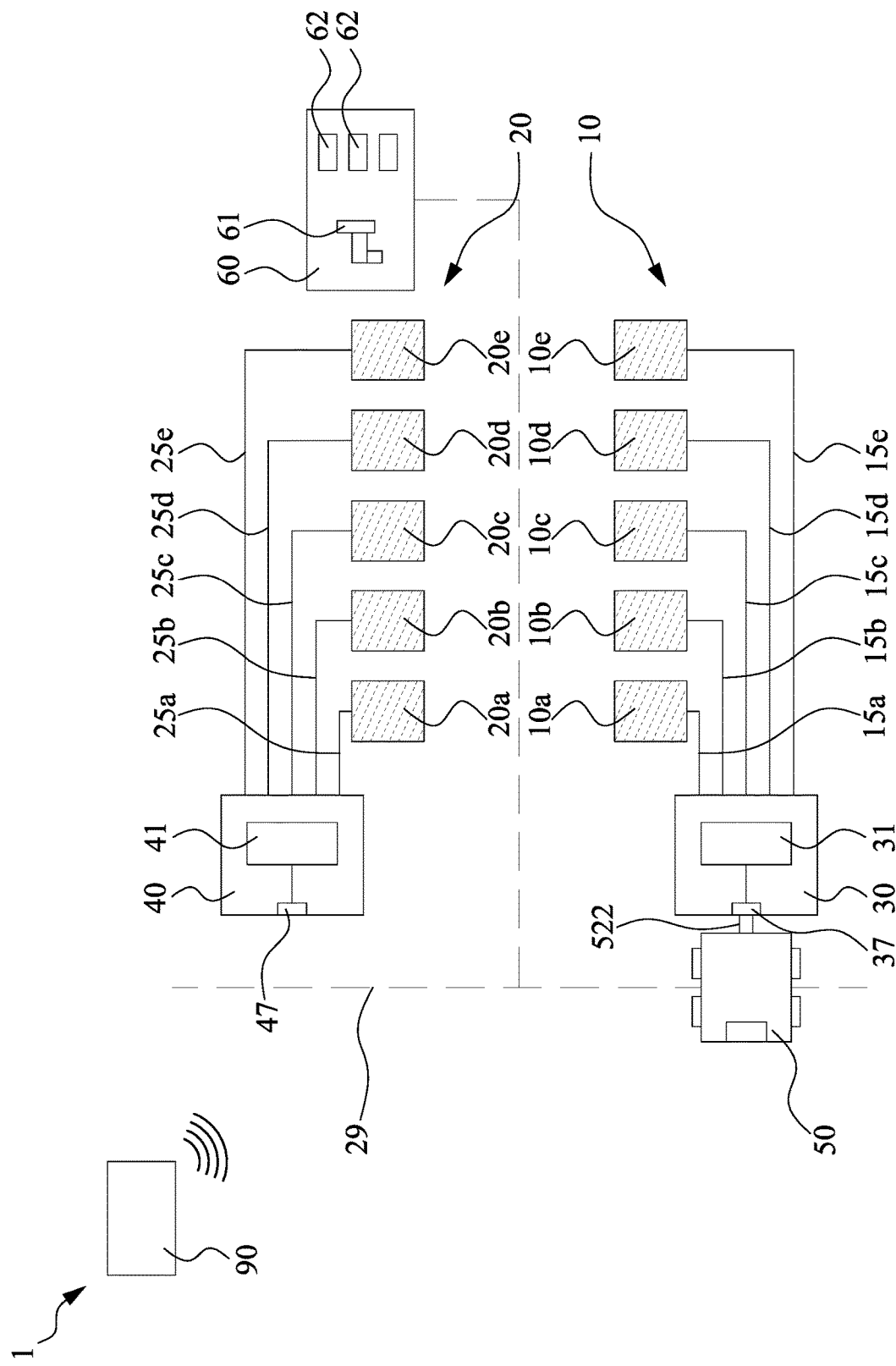
FIG. 7 is a schematic view of one stage of a method of monitoring a semiconductor fabrication facility, in accordance with one or more embodiments of the present disclosure.

The method S800 includes operation S801, in which a detection vehicle, such as the detection vehicle 50, is actuated to one of the sampling stations 30 and 40. In some embodiments, as shown in FIG. 7, the detection vehicle 50 receive a command from the control system 90 and is driven to move to a position adjacent to the first sampling station 30. During the movement of the detection vehicle 50 to the first sampling station 30, the vehicle positioning module 54 of the detection vehicle 50 continuously detect the surrounding, and the vehicle driving module 53 may stop or slow down the detection vehicle 50 when an obstacle is located at the predetermined path 29. In some embodiments, during the movement of the detection vehicle 50 to the first sampling station 30, an audible warning may be produced by the detection vehicle 50 to warn the operation in the semiconductor fabrication facility 1 that the detection vehicle 50 is approaching.

The method S800 continues with operation S802, in which the gas line 521 of the detection vehicle 50 is connected to the first sampling station 30. In some embodiments, after the operation S801, the detection vehicle 50 may slightly adjust the position of the detection vehicle 50 according to the sensory data produced by the vehicle positioning module 54 so as to align the distal end 522 of the gas line 521 with the fastening member 37 of the first sampling station 30. When the distal end 522 of the gas line 521 is aligned with the fastening member 37 of the first sampling station 30, the gas line 521 is inserted into the fastening member 37 and is engaged with the fastening member 37. As such, a fluid connection between the detection vehicle 50 and the first sampling station 30 is established.

The method S800 continues with operation S803, a gas sample is collected by the detection vehicle 50 from one of the processing tools 10a, 10b, 10c, 10d and 10e through the first sampling station 30, and the gas sample is measured by the detection vehicle 50. In some embodiments, when the detection vehicle 50 is connected with the first sampling station 30, the detection vehicle 50 sends, via the communication interface 58, a signal to the controller 36 of the first sampling station 30 to control the rotation angle of the rotatory valve 31 so as to collect the gas sample from one specific processing tool. For example, as shown in FIGS. 3 and 4, when defect is found in a batch of semiconductor wafers processed by the processing tool 10a, the operator may call the detection vehicle 50 to the first sampling station 30 and collect a gas sample from the processing tool 10a to determine whether an abnormality exists in the processing tool 10a.

In some embodiments, as shown in FIG. 4, when the detection vehicle 50 is fluid connected to the sampling tube 15a, the other sampling tubes 15b, 15c, 15d and 15e are isolated from the connection port 342, so that the gas sample may not be polluted by the other gaseous material from the sampling tubes 15b, 15c, 15d and 15e. In some embodiments, before the collection of the gas sample, the connection port 342 is purged with gas supplied from the bypassing line 38 to remove the gas in the connection port which is left after the measurement of the other gas sample from different processing tool. As a result, a detection accuracy of the gas measurement can be improved. The gas supplied from the bypassing line 38 may be ambient gas in the semiconductor fabrication facility 1. Alternatively, the bypassing line 38 may be zero-order standard gas (such as nitrogen gas).

In some embodiment, when the gas sample is driven to pass through the connection port 342, the flow meter 33 which is connected to the connection port is used to measure the flowing rate of the gas sample in the connection port 342. The measurement result is transmitted to the detection vehicle 50, and the detection vehicle 50 would issue a warning when the flowing rate is lower than a predetermined values. In some embodiments, the measurement of the environment parameters may be sensitive to the flowing rate of the gas sample. By monitoring the flowing rate of the gas sample in the connection port 342, a measurement error can be avoided.

The method S800 continues with operation S804, a parameter of the gas sample is compared with a range of acceptable values. The parameter of the gas sample measured by the metrology module 51 of the detection vehicle 50 may include temperature, humidity, magnetic field strength/direction, inorganic ion type/concentration in micro/nano-scale aerosol particles, organic contaminant concentration, particle concentration etc. The data in relation to the parameter of the gas sample may be compare with a preset value stored in the memory of the detection vehicle 50. The preset value may indicate a parameter under which a batch of semiconductor wafers is processed and no defect is found in such batch of semiconductor wafers.

When the data in relation to the parameter of the gas sample is out of the range of acceptable values, the method S800 continues with operation S805 to issue a warning. In some embodiment, the control system 90 may issue a warning in response to the out-of-spec measurement result to stop an operation of the corresponding processing tool 10a of the first group of processing tools 10. In addition, the control system 90 call an operator to check if any abnormality is occurred in the processing tool 10a.

If the parameter of the gas sample is within the range of acceptable values, the method S800 continues with operation S806, to determine if there is still another processing tool to be measured in the processing tool. In some embodiments, the detection vehicle 50 is used to measure more than one gas samples collected from different processing tools 10a, 10b, 10c, 10d and 10e. In such embodiment, when the measurement of one of the gas samples is completed, another measurement may proceed in response to a command issue from the detection vehicle 50. For example, when the measure more than one gas samples collected from the processing tool 10a is completed, the detection vehicle 50 may issue, via the communication interface 58, another command to the controller 36 to establish a fluid connection between the detection vehicle 50 and the processing tool 10b. In some embodiments, the operation of connecting the detection vehicle 50 to the processing tool 10b may be finished before the measurement of the gas sample from the processing tool 10a is completed. Therefore, once the measurement of the gas sample from the processing tool 10a is completed, the gas in the processing tool 10b can be drawn from the processing tool 10b via the first sampling station 30 immediately so as to reduce the time to perform the measurement operation.

Figure 8:
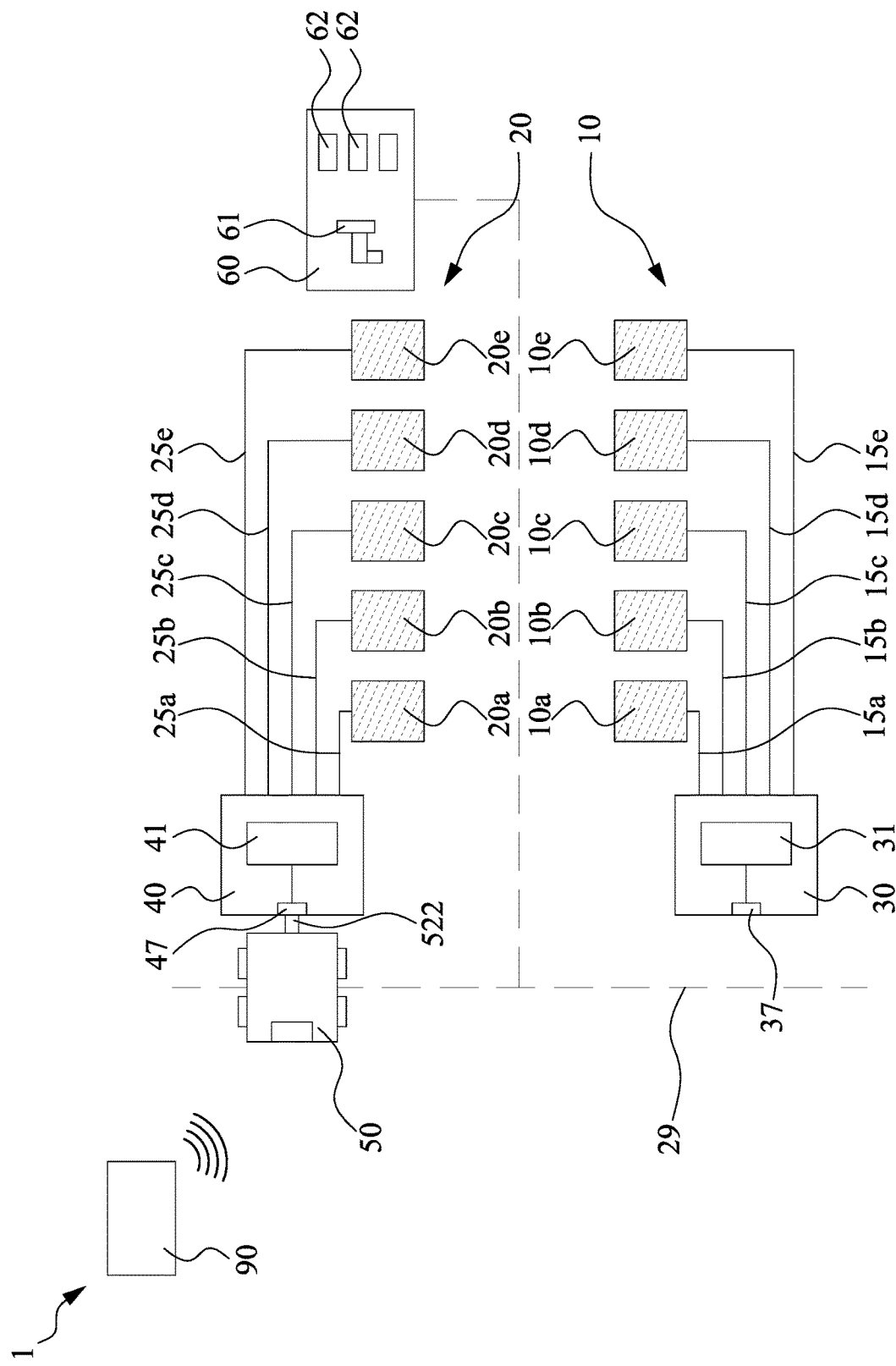
FIG. 8 is a schematic view of one stage of a method of monitoring a semiconductor fabrication facility, in accordance with one or more embodiments of the present disclosure.

If there is no processing tool which is connected to the first sampling station 30 to be measured according to a preset schedule, the method S800 continues with operation S807, in which the sampling tube of the detection vehicle 50 is disengaged from the first sampling station 30, and the detection vehicle 50 is sent to another position in the semiconductor fabrication facility 1. For example, as shown in FIG. 8, the detection vehicle 50 may be sent to the second sampling station 40 and connected to the fastening member 47 of the second sampling station 40 so as to collect gas from processing tools, such as one or more of the processing tools 20a, 20b, 20c, 20d and 20e, via a rotatory valve 41. In some embodiments, to perform the measurement process to the second sampling station 40, the method S800 may repeat operations S801-S807.

Figure 9:
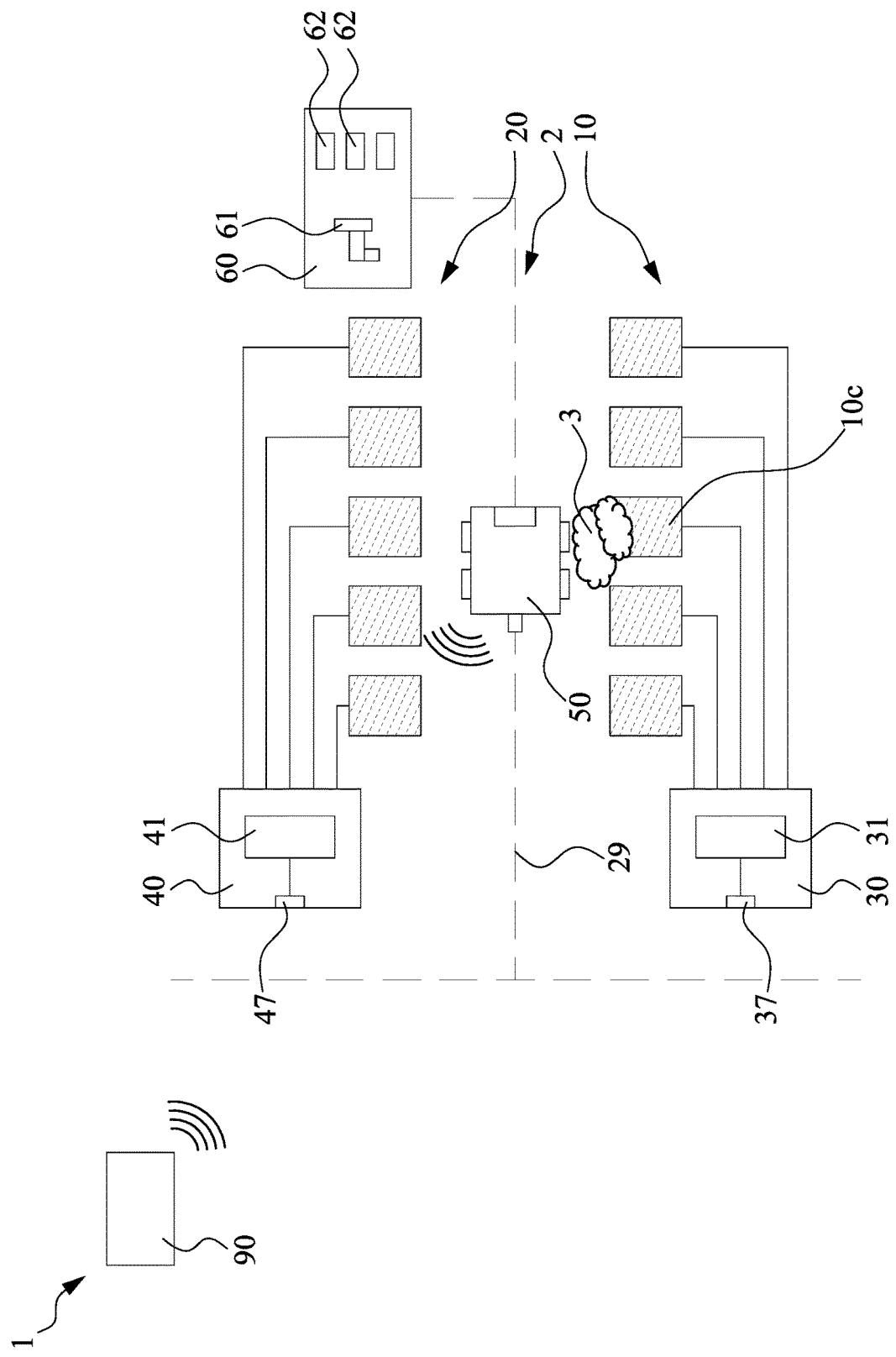
FIG. 9 is a schematic view of one stage of a method of monitoring a semiconductor fabrication facility, in accordance with one or more embodiments of the present disclosure.

In some embodiments, the method S800 further includes performing a patrol mode to move the detection vehicle 50 along a predetermined path 29 in the semiconductor fabrication facility 1. For example, as shown in FIG. 9, the detection vehicle 50 may patrol along the predetermined path 29. The predetermined path 29 may extends along a passage 2 that is formed between the first group of processing tools 10 and the second group of processing tools 20. In addition, the method S800 includes operation S809, in which, the detection vehicle 50 collects ambient gas sample 3 from the semiconductor fabrication facility 1 and measure as least one parameter of the ambient gas. For example, during the movement of the detection vehicle 50, the detection vehicle 50 continuously or periodically collects ambient gas sample 3 from the semiconductor fabrication facility 1 and measure as least one parameter of the ambient gas via the vent 526 (FIG. 5) to detect environmental parameter by the metrology module 51.

In operation S810, parameter of the ambience is compared with a range of acceptable values. The environmental parameter may detected by the metrology module 51 of the detection vehicle 50 may include temperature, humidity, magnetic field strength/direction, inorganic ion type/concentration in micro/nano-scale aerosol particles, organic contaminant concentration, particle concentration etc. The data in relation to the parameter of the gas sample may be compare with a preset value stored in the memory of the detection vehicle 50. The preset value may indicate a parameter under which a desired environmental condition of the semiconductor fabrication facility 1. When the data in relation to the parameter of the gas sample is out of the range of acceptable values, the method S800 continues with operation S811 to issue a warning. The detection vehicle 50 may transmit data in relation to its location to the control system 90 in operation S811. The detection vehicle 50 may also transmit data in relation to the qualitative and quantitative analysis result to the control system 90. The control system 90 may issue a warning in response to the analyzing result and call an operator according to the information produced by the detection vehicle 50 to check if any abnormality is occurred in the processing tools which is located around the detection vehicle 50. If an abnormality is found, the operator may perform a maintenance procedure or the operator may clear the warning by making a request to the control system 90.

After the warning is issued by the control system 90, the method continues with operation S812, in which the movement of the detection vehicle 50 is stopped and the detection vehicle 50 continues the measurement of the ambience until the parameter is acceptable. As a result, the operation may use the sensory data produced by the detection vehicle 50 to determine how to fix the issue of the processing tool and/or determine if the issue is fixed or not after the maintenance procedure.

In operation S813, the control system 90 determines if the patrol mode of operation S808 is completed after operation S810 or operation S812. If the patrol mode is completed, the method S800 is finished; otherwise, the method S800 repeats operations S808-S810.

Figure 10:
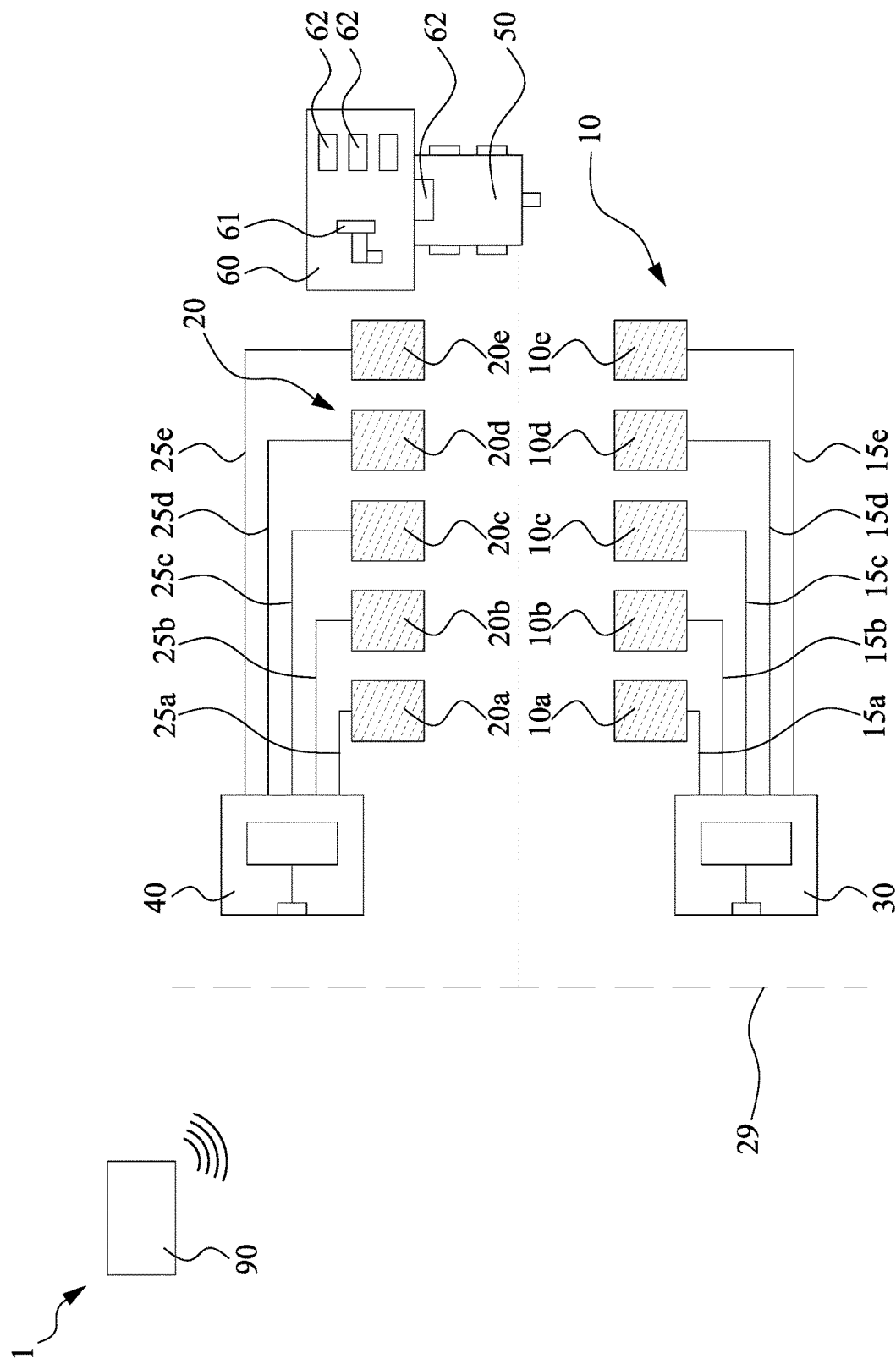
FIG. 10 is a schematic view of one stage of a method of monitoring a semiconductor fabrication facility, in accordance with one or more embodiments of the present disclosure.

In some embodiments, as shown in FIG. 10, during the operation of the detection vehicle 50, the battery level is continuously monitored by the control system 90. When the control system 90 indicates that the battery power is below a preset value, the control system 90 will send the detection vehicle 50 to a battery station 60 to replace the battery 62. The battery station 60 may include a robot arm 61 that automatically removes the battery 62 from the detection vehicle 50 and mounts the detection vehicle 50 with a new and fully charged battery 62.

Embodiments of the present disclosure provide a method of monitoring a semiconductor fabrication facility by collecting and analyzing ambient air in the FAB and/or the processing tool. Gas sample from the processing tool is collected by a sampling station which connected with multiple processing tools and further delivered to a detection vehicle. Therefore, the detection vehicle can not only detect ambience in the FAB but also detect gas sample in the processing tools. The analyzing results provide a continuous, online, and real-time monitoring of these contaminant levels so as to help identify sources, stabilize production and prevent unexpected shortfalls of the service life of filtration units.

According to one embodiment of present disclosure, a semiconductor fabrication facility (FAB) is provided. The FAB includes a first group of processing tools. The FAB also includes a first sampling station connected to the first group of processing tools. In addition, the FAB includes a detection vehicle detachably connected to the first sampling station and comprising a metrology module. When the detection vehicle is connected to the first sampling station, a gas sample is delivered from one of the first group of processing tools to the metrology module of the detection vehicle via the first sampling station for performing a measurement of a parameter in related to the gas sample by the metrology module. In addition, the FAB includes a control system configured to issue a warning when the parameter in related to the gas sample from the one of the first group of processing tools is out of a range of acceptable values associated with the one of the first group of processing tools.

According to another embodiment of present disclosure, a detection vehicle for measurement of a condition of semiconductor fabrication facility is provided. The detection vehicle includes a gas line fluidly connected to a processing tool for processing a semiconductor wafer. The detection vehicle also includes a metrology module fluidly connected to the gas line and configured to measure at least one parameter of a gas sample taken from the processing tool. The detection vehicle further includes a vehicle driving module configured to move the detection vehicle in the semiconductor fabrication facility to connect the detection vehicle with another processing tool.

According to yet another embodiment of present disclosure, a method of monitoring a semiconductor fabrication facility is provided. The method includes actuating a detection vehicle to move to a first sampling station, wherein the first sampling station is fluidly connected to a first group of processing tools. The method also includes connecting a gas line of the detection vehicle to the first sampling station. The method further includes collecting a first gas sample, through the first sampling station, from one of the first group of processing tools. In addition, the method includes issuing a warning when a parameter in related to the first gas sample from the one of the first group of processing tools is out of a range of acceptable values associated with the one of the first group of processing tools.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor fabrication facility, comprising:
   a first group of processing tools;
   a first sampling station connected to the first group of processing tools;
   a detection vehicle detachably connected to the first sampling station and comprising a metrology module, wherein when the detection vehicle is connected to the first sampling station, a gas sample is delivered from one of the first group of processing tools to the metrology module of the detection vehicle via the first sampling station for performing a measurement of a parameter in related to the gas sample by the metrology module; and
   a control system configured to issue a warning when the parameter in related to the gas sample from the one of the first group of processing tools is out of a range of acceptable values associated with the one of the first group of processing tools.

2. The semiconductor fabrication facility of claim 1, further comprising
   a second group of processing tools; and
   a second sampling station connected to the second group of processing tools;
   wherein the detection vehicle detachably connected to the second sampling station, and the control system is configured to issue a warning when the parameter in related to the gas sample from one of the second group of processing tools is out of a range of acceptable values associated with the second group of processing tools.

3. The semiconductor fabrication facility of claim 1, wherein the control system is configured to stop an operation of the one of the first group of processing tools in response to the warning.

4. The semiconductor fabrication facility of claim 1, wherein the one of the first group of processing tools comprises:
   a load port configured for positioning a wafer carrier;
   a reaction chamber configured for processing a semiconductor wafer; and
   an interface chamber located between the load port and the reaction chamber, wherein a sampling tube is connected between the interface chamber and the first sampling station for a delivery of the gas sample from the one of the first group of processing tools to the first sampling station.

5. The semiconductor fabrication facility of claim 1, wherein the detection vehicle comprises a vent, and an ambient gas sample is taken from an ambience of the semiconductor fabrication facility to the metrology module through the vent for performing a measurement of a parameter in related to the ambience by the metrology module.

6. The semiconductor fabrication facility of claim 1, wherein the metrology module is configured to measure a parameter associated with the gas sample comprising total organic carbon (TOC), graphite fluorine intercalation compounds (CxF), and humidity.

7. The semiconductor fabrication facility of claim 1, the first sampling station comprises:
a rotatory valve comprising a first conduit having a connection port which is detachably connected to the detection vehicle; and
a plurality of sampling tubes connecting the first group of processing tools to the rotatory valve, wherein the rotatory valve is configured such that the first conduit is fluidly connected to one of the sampling tubes but isolated from the other sampling tubes for delivering the gas sample from the one of the first group of processing tools to the detection vehicle at one time.

8. The semiconductor fabrication facility of claim 1, wherein the first sampling station comprises a flow meter positioned on a flowing path of the gas sample in the first sampling station for detecting a flowing rate of the gas sample.

9. A detection vehicle for measurement of a condition of semiconductor fabrication facility, the detection vehicle comprising:
a gas line fluidly connected to a processing tool for processing a semiconductor wafer;
a metrology module fluidly connected to the gas line and configured to measure at least one parameter of a gas sample taken from the processing tool; and
a vehicle driving module configured to move the detection vehicle in the semiconductor fabrication facility to connect the detection vehicle with another processing tool.

10. The detection vehicle of claim 9, further comprising a vent, wherein the metrology module fluidly connected to the vent and is configured to perform a measurement of a parameter in related to the ambience taken from the vent.

11. The detection vehicle of claim 9, wherein the metrology module is configured to measure a parameter associated with the gas sample comprising total organic carbon (TOC), graphite fluorine intercalation compounds (CxF), and humidity.

12. The detection vehicle of claim 9, further comprising a communication module configured to issue a signal to control a delivery of the gas sample from the processing tool to the metrology module via the gas line.

13. A method of monitoring a semiconductor fabrication facility, comprising:
actuating a detection vehicle to move to a first sampling station, wherein the first sampling station is fluidly connected to a first group of processing tools;
connecting a gas line of the detection vehicle to the first sampling station;
collecting a first gas sample, through the first sampling station, from one of the first group of processing tools; and
issuing a warning when a parameter in related to the first gas sample from the one of the first group of processing tools is out of a range of acceptable values associated with the one of the first group of processing tools.

14. The method of claim 13, further comprising:
disengaging the gas line of the detection vehicle from the first sampling station;
actuating the detection vehicle to move to a second sampling station, wherein the second sampling station is fluidly connected to a second group of processing tools;
connecting the gas line of the detection vehicle to the second sampling station;
collecting a second gas sample, through the second sampling station, from one of the second group of processing tools; and
issuing a warning when a parameter in related to the second gas sample from the one of the second group of processing tools is outside the range of acceptable values associated with the one of the second group of processing tools.

15. The method of claim 13, further comprising stopping an operation of the one of the first group of processing tools in response to the warning.

16. The method of claim 13, further comprising:
collecting an ambient gas sample from a clean room by the detection vehicle; and
issuing a warning when a parameter in related to the ambient gas sample detected by the metrology device in the detection vehicle is out of a range of acceptable values.

17. The method of claim 13, wherein the first sampling station is fluidly connected to an interface chamber of the one of the first group of processing tools, wherein the interface chamber comprises an enclosure and located between a load port, for supporting a wafer carrier, and a processing chamber, for performing a process over a semiconductor wafer.

18. The method of claim 13, wherein the parameter comprises total organic carbon (TOC), graphite fluorine intercalation compounds (CxF), and humidity.

19. The method of claim 13, wherein the collecting the first gas sample, through the first sampling station, from the one of the first group of processing tools comprising:
guiding a flow of gas from the first group of processing tools to the first sampling station to pass a plurality of sampling tubes; and
connecting one of the sampling tubes that connected to the one of the first group of processing tools with a connection port while isolating the other sampling tubes from the connection port, wherein the detection vehicle collects the first gas sample from the sampling station via the connection port.

20. The method of claim 13, further comprising:
measuring a flow rate of the first gas sample in a flowing path of the first gas sample; and
issuing a warning when the flow rate of the first gas sample is less than a predetermined value.

* * * * *